United States Patent [19]

Swisher

[11] Patent Number: 5,137,791
[45] Date of Patent: Aug. 11, 1992

[54] METAL-FILM LAMINATE RESISTANT TO DELAMINATION

[75] Inventor: Richard L. Swisher, Northfield, Minn.

[73] Assignee: Sheldahl Inc., Northfield, Minn.

[21] Appl. No.: 681,073

[22] Filed: Apr. 5, 1991

Related U.S. Application Data

[62] Division of Ser. No. 580,505, Sep. 13, 1990.

[51] Int. Cl.[5] .................. B32B 3/10; B32B 15/08
[52] U.S. Cl. ..................... 428/612; 428/623; 428/626; 428/632; 428/675; 428/938
[58] Field of Search ............ 428/626, 622, 623, 632, 428/601, 675, 672, 938

[56] References Cited

U.S. PATENT DOCUMENTS

| | | | |
|---|---|---|---|
| 3,149,021 | 9/1964 | Goepfert et al. | 161/214 |
| 3,477,900 | 11/1969 | Soukup et al. | 161/194 |
| 3,700,538 | 10/1972 | Kennedy | 161/93 |
| 3,981,691 | 9/1976 | Cuneo | 428/626 |
| 4,081,578 | 3/1978 | van Essen et al. | 428/63 |
| 4,093,768 | 6/1978 | Cordts et al. | 428/287 |
| 4,153,518 | 5/1979 | Holmes et al. | 204/38 |
| 4,189,517 | 2/1980 | Shanoski et al. | 428/423 |
| 4,193,849 | 3/1980 | Sato | 204/38 |
| 4,395,313 | 7/1983 | Lindsay et al. | 204/30 |
| 4,402,998 | 9/1983 | Kumagai et al. | 427/97 |
| 4,414,173 | 11/1983 | Cobbledick et al. | 264/257 |
| 4,420,509 | 12/1983 | Barrell et al. | 427/206 |
| 4,444,848 | 4/1984 | Shanefield et al. | 428/624 |
| 4,524,089 | 6/1985 | Hague et al. | 427/38 |
| 4,568,413 | 2/1986 | Toth et al. | 156/151 |
| 4,582,564 | 4/1986 | Shanefield et al. | 156/643 |
| 4,597,828 | 7/1986 | Tadros | 156/643 |
| 4,720,401 | 1/1988 | Ho et al. | 427/250 |
| 4,772,488 | 9/1988 | Pinch et al. | 427/39 |
| 4,835,061 | 5/1989 | Ohta et al. | 428/469 |
| 4,863,808 | 9/1989 | Sallo | 428/626 |
| 4,886,681 | 12/1989 | Clabes et al. | 427/38 |
| 4,913,938 | 4/1990 | Kawakami et al. | 427/383 |
| 4,916,016 | 4/1990 | Bristowe et al. | 428/411.1 |
| 5,015,538 | 5/1991 | Krause et al. | 428/626 |

FOREIGN PATENT DOCUMENTS

| | | |
|---|---|---|
| 041850 | 6/1981 | European Pat. Off. . |
| 1225940 | 6/1959 | Fed. Rep. of Germany . |
| 3017713 | 11/1981 | Fed. Rep. of Germany . |
| 1305595 | 6/1988 | Japan . |
| WO89/04880 | 11/1988 | PCT Int'l Appl. . |

OTHER PUBLICATIONS

V. Fronz and R. Mueller, "Plasma Pretreatment of Polyimide Films" Abstract Renker GmbH & Co. KG, Hausener Weg 1, 7800 Freiberg, Society of Vacuum Coaters 32nd Annual Technical Conference Proceedings, Apr. 24–28, 1989, St. Louis, Mo.

*Primary Examiner*—Michael Lewis
*Assistant Examiner*—Valerie Lund
*Attorney, Agent, or Firm*—Merchant, Gould, Smith, Edell, Welter & Schmidt

[57] ABSTRACT

A flexible metal-film laminate can comprise a layered film structure having a metal layer securely bonded to a film layer. The laminate contains a unique metal-oxide attachment structure between the film and metal layer comprising randomly distributed regions of metal-oxide. The peel strength of such a laminate is significantly improved over prior laminates and is resistant to peel strength reduction due to environmental stress. The preferred metal-film laminates made with polyester or polyimide can be used in the manufacture of high-quality, low cost, flexible printed circuit boards.

29 Claims, 2 Drawing Sheets

METAL-FILM LAMINATE RESISTANT TO DELAMINATION

This is a division, of application Ser. No. 07/580,505, filed Sep. 13, 990, pending.

FIELD OF THE INVENTION

The invention relates to a flexible metal-film laminate having a metal layer securely bonded to a film. The metal layer can be made resistant to delamination as measured by a 90° peel strength of at least 3 pounds per inch width measured at a speed of about two inches per minute. Such metal-film laminates are ideal for many uses including packaging, flexible printed wiring boards, insulation, labels, decorative layers, anti-static films, reflective layers, antennas, heaters, etc. Such laminates can be subjected to environmental stress, mechanical stress and chemical treatment without significant delamination.

BACKGROUND OF THE INVENTION
A. Film Treatment and Metal Forming Process

Flexible metal-film laminate materials have become the focus of great interest in recent years. A variety of techniques including film pre-treatment processes and metal layer forming processes have been studied to improve the properties of laminates. Such processes include film etching, organic coatings, the sputtering of metal, the adhesive lamination of pre-formed metal foil to film, electroless plating, electroplating, and others. Such metal-film laminate products each have different characteristics including metal thickness, metal tensile strength, laminate flexibility, delamination tendency, etc.

One useful metal forming method involves producing a "tie coat" of chromium typically on a polyimide surface. Such tie coats are equal to or greater than 50 nanometers, greater than 100 atomic layers, of chromium atoms, in thickness and aid in bonding a electroplated copper layer to polyimide. We are aware that a successful film laminate comprises a film having a greater than 50 nanometer thickness (more than 100 atom monolayers) chromium tie coat and a plated copper layer having a thickness of greater than 0.1 μm. Such laminates are inconvenient to process into wiring boards because they generally require two etch steps, one basic etch for copper and a second acid etch for chromium. Polyimide laminates with a "tie coat" have acceptable peel strength but can be expensive to produce and use in applications requiring low cost materials.

Kennedy, U.S. Pat. No. 3,700,538 discloses an adhesive used to bond copper foil to resin impregnated fiber glass cloth using a polyimide resin adhesive. The use of an adhesion promoter to bond metal to an insulating base material is known. For example, Soukup, U.S. Pat. No. 3,477,900 and Goepfert et al., U.S. Pat. No. 3,149,021 discloses that when the insulating base material comprises methylmethacrylate resin, an unsaturated polyester may be added to the resin as an adhesion promoter to bond a copper foil. However, these patents disclose that an increase in the proportion of polyester is generally accompanied by a decrease in an adhesion of the copper foil to the resinous base. Barrell et al., U.S. Pat. No. 4,420,509 and Cordts et al., U.S. Pat. No. 4,093,768 disclose procedures for preparing polyester resin copper clad laminates. These processes require several steps or expensive continuously operating equipment.

Van Essen, U.S. Pat. No. 4,081,578; Shanoski et al., U.S. Pat. No. 4,189,517 and Cobbledick et al., U.S. Pat. No. 4,414,173 are directed to in-mold coating processes which are substantially different from the present process in that a preform substrate is either made or placed in a mold and cured. The mold is opened and a small amount of resin is placed on the molded substrate sufficient to form a coating up to about 20 mils. in thickness. The mold is then closed over the polymerizing resin to apply pressure.

Japanese Patent No. 57083-427 discloses a process where an insulation material is mounted on an inner surface of an injection mold and a metal foil is overlaid on the insulated surface and fixed. A thermoplastic resin is melt-injected into the mold to provide a resin product laminated firmly with the metal foil.

Bristowe et al, U.S. Pat. No. 4,916,016 also teaches injection molded metal-thermoset laminates.

Kawakami et al, U.S. Pat. No. 4,913,938 teaches coating a resin substrate with a copper solution and heating in a non-oxidizing atmosphere to increase copper laminate adhesion.

Pinch et al, U.S. Pat. No. 4,772,488 teaches the use of a carbon dioxide plasma to treat and clean dielectric layers.

Haque et al, U.S. Pat. No. 4,524,089 uses a three step plasma treatment of copper foils. Shanefield et al., U.S. Pat. Nos. 4,444,848 and 4,582,564 teach a sputter etching of a rubber modified epoxy surface or coating.

Holmes et al, U.S. Pat. No. 4,153,518 teaches treating a refractory metal oxide layer to improve adhesion of oxide forming metals.

Toth et al, U.S. Pat. No. 4,568,413 teaches forming a releasable metallic layer on a polymeric carrier, adhering the releasable metal onto a substrate and peeling the carrier.

Sato, U.S. Pat. No. 4,193,849 teaches conventional pre-treatments of plastic prior to electro-chemical deposition of metal surfaces. Ho et al., U.S. Pat. No. 4,720,401 teaches heating a film substrate to a temperature between 0.6 and 0.8 of the curing temperature ($T_c$) of the substrate material, commonly an elevated temperature exceeding 200° C. (often 240°-280° C.) and evaporating or sputtering metal ions such that a metal ion can interact with the heated substrate layer and penetrate into the interior of the heated substrate. The processes in Ho et al are done in an inert atmosphere and produce no metal oxide.

Fronz et al, *Plasma Pretreatment of Polyimide Films*, a paper presented at the Apr. 24–28, 1989 meeting of the Soc. of Vacuum Coaters, teach many of the drawbacks of copper-polyimide laminates. Fronz et al teaches that surface cleaning of the polyimide film will increase peel strength. Fronz et al does not discuss the importance of metal-oxide adhesion structures nor uses metallic methods in the film treatment.

One pre-treatment technique used with films called "corona discharge" has been found to aid in surface cleaning but not helpful in introducing binding structures to promote the peel strength of laminates. Corona discharge uses ceramic elements or other types of non metallic electrode and an ambient atmosphere temperature/pressure discharge to generate UV radiation and ozone ($O_3$). This treatment apparently produces no new metal/film metal-oxide/film structure on the surface of the film and does not appear to promote film-laminate bonding.

While film treatment steps and metal forming processes are known, a fully satisfactory laminate has not been prepared. In particular, no fully satisfactory polyimide laminate is known for use in printed circuit board manufacture.

B. Delamination Tendency of Laminates

In general, metal-film laminates, which can be formed by forming (plating) metal onto the film or onto treated film, have a tendency to delaminate during and after the formation of a plated metal layer having a thickness of about 0.1 to 35 μm. The peel strength of many such laminates currently in use is generally felt to be insufficient for many end uses because any delamination can cause the failure of the laminate to operate in its intended use. However, even the peel strength currently achievable in many films can be still further decreased by exposure of the film to processing chemicals (etchants, cleaners, coatings, etc.) and environmental stress (such as humidity in the case of polyimide) and can be reduced to much less than 3 pounds per inch and in certain instance, can be much less than 1 pound per inch. Delamination of the metal layer can result in the failure of the material to be reflective, insulating, an adequate packaging material or to function in a useful circuit assembled on a printed wiring board made from the laminate.

A variety of other influences can promote the delamination of metal poorly bonded to film substrate. First, the strength of the laminate bond is an important characteristic. Higher strength bonds reduce delamination tendency. Further, the mechanical stresses (soldering, film flex during processing, etc.) involved in first forming the metal on the flexible film and in subsequent processing steps can cause the film to distort or flex and can cause the poorly bonded metal to leave the film.

Additionally, a number of polymer surfaces are known to be less likely to maintain an integral laminate structure. Fluorocarbon resins, polyethylene, polypropylene, and polyvinylidiene chloride or polyvinylidiene-fluoride films tend to be difficult surfaces for metal bonding.

Flexible printed circuit boards are currently one preferred circuit manufacturing format used in a variety of electronic devices. These boards are fabricated from flexible plastic substrates having a thin copper metal laminate layer and can have conductive metal on one or both surfaces with through-hole intercollections. During circuit fabrication, copper is selectively removed by chemical etching or is pattern plated to leave a pattern of the desired interconnecting circuitry between various components in an electronic circuit. With improvements in etching technology, intercircuit line spacings approaching two-thousandths of an inch can be achieved. Narrow line spacing is one of the current technical innovations that permit continued miniaturization of complex circuitry. However, a narrow line width can promote delamination.

As a result of the problems in laminate preparations and the rigors of the laminate use, an increase in the bond strength of the metal layer to the film polymer substrate is a highly desirable end in the production of inexpensive delamination resistent metal-film laminates. Further, production of low cost polyester laminate and low cost polyimide laminate, free of a "tie coat", has not been achieved despite a long felt need.

Accordingly, a substantial need exists for delamination resistant metal-film laminates and for processes for the preparation of such laminate materials from the film materials including polyester and polyimide. A further need exists to form delamination resistant metal-film laminates on hard to bond films. The preferred laminates are substantially resistant to delamination caused by either chemical treatments or mechanical stresses.

BRIEF DISCUSSION OF THE INVENTION

We have found in the manufacturing of metal-film laminates, that a laminate resistant to delamination can be made by a process comprising (1) treating a film with a plasma, comprising ionized oxygen produced from a metallic electrode, to form a metal-oxide treated film, and (2) forming a first metallized layer with a thickness of about 50 to 500 nanometers, preferably 100 to 300 nanometers, preferably by vacuum metallization of metal, onto the metal-oxide treated film. Such films have many uses and can be used in the manufacture of thicker laminate by forming a second metal layer with a thickness of 0.1 to 35 μm on the metallized layer.

The plasma pretreated film surface, the metal-oxide, the vacuum metallized layer and the second metal layer cooperate to ensure that the formed metal surface is securely bonded to the film and is delamination resistant. The peel strength of the resulting laminate can be greater than about 3 pounds per inch, and can be in excess of 10 pounds per inch. Unlike laminates made by other processes, the peel strength of the laminate of the invention, and in particular polyimide laminate, can be substantially resistant to change when exposed to heat, chemical treatment, mechanical stress or environmental stress.

We have also found a novel structure resulting from the plasma pre-treatment of this invention. In the production of a plasma comprising ionized oxygen, an electric field is established across the plasma producing gas. The electric field exhibits a potential difference across the gas which can maintain a suitable plasma supporting ionizing current. In the production of the plasma, conductive rods are introduced into the plasma chamber and act as source or drain electrodes for the current. Such electrodes can be either positively or negatively biased and are typically made of plasma resistant or corrosion resistant metals such as copper, titanium, stainless steel, aluminum, etc. The rods can contain a large variety of metals. We have found in the production of plasmas useful in manufacturing the treated films of the invention, that the plasma production is preferably conducted with sufficient current flow such that metal atoms or clusters, driven from the metal electrodes, are oxidized to metal-oxide and interact with and bond to the surface of the film. We have found that the metal-oxide or metal-oxide clusters, which are embedded in the polymeric film, in a random discontinuous, fashion, are characteristic of the high peel strength produced in the invention.

We have further found that this process and product is suitable for the fabrication of a variety of products and is particularly suited to the production of flexible printed wiring (printed circuit) boards made by pattern plating metal or by selectively etching or removing metal from the laminate leaving a wiring pattern on the surface of the film. Unlike many laminates which need both acidic and basic etchants, a printed wiring board can be made from the laminate of the invention with a single basic chemical etching step. Further, the process and product of the invention can be used in the manufacture of double sided printed wiring boards with through hole interconnections. Further, the flexible laminates of the invention can be adhered to more rigid support materials such as cardboard, epoxy prepreg, corrugated board, polymer sheets, engineering plastic sheets, etc. The printed wiring boards made using the laminate of this invention can be plated, etched, cut, drilled, assembled, soldered and used under usual operating conditions with no significant delamination caused by such environmental stress, mechanical stresses or chemical treatment steps. In copper-polyimide laminate manufacturing, after the plasma treatment step, but before the vacuum metallization step, a metal sputtering, preferably a copper sputtering step can be practiced to further improve peel strength.

By the term "ionized oxygen" we mean a material that, when placed in the heated, reduced pressure, electric field conditions that form an ionized plasma, forms an oxygen plasma or oxygen ions through the ionization of single atoms or molecules of oxygen or by the disruption of molecules containing oxygen atoms.

DETAILED DESCRIPTION OF THE INVENTION

Figure 1:
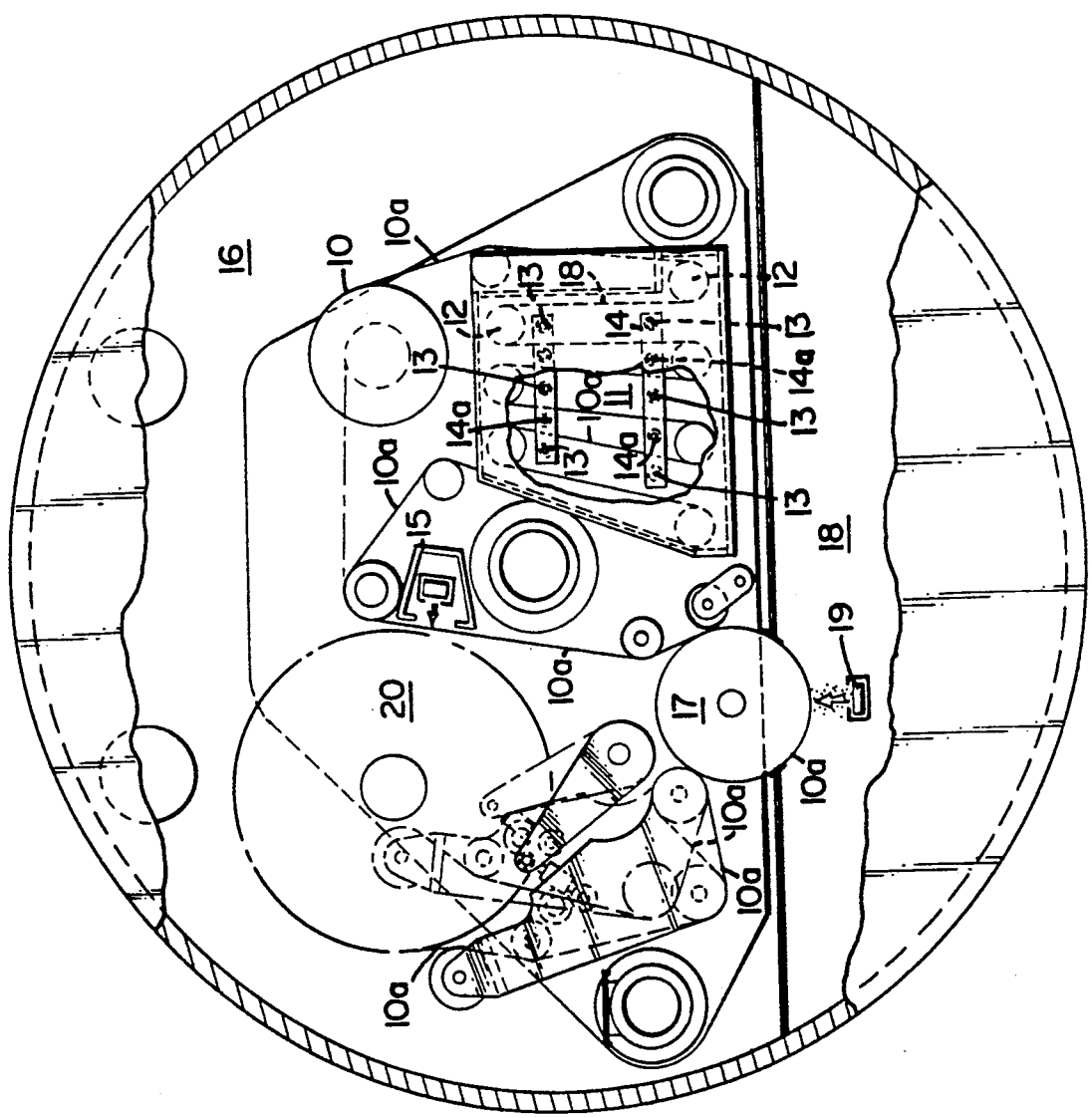
FIG. 1 is a cross-sectional representation of a low pressure single-unit vacuum treatment chamber including stations for a film roll, plasma treatment, optional sputtering, vacuum metallizing and a treated film take-up roll. The unit contains regions that vary in pressure from area to area.

We have found a novel metal-film laminate structure exhibiting a substantial increase in peel strength between metal and film polymer surface when compared to prior art metal-film laminates. The novel structure comprises a random distribution of metal-oxide or clusters of metal-oxides of metals including Cr, Ti, Fe, Ni, Mo, Mn, Zr, Al, or other metals common to metallic electrode rod materials, e.g., stainless steels etc., on the surface of the polymer film which aid in bonding the metallized layer to the film. Such atoms are introduced into the surface of the polymeric film in an initial oxygen plasma treatment of the polymer surface and are believed to be less than 20, more likely less than 5 atomic layers in thickness. Such randomly located metal-oxide regions are preferably noncontiguous and act as anchoring sites binding the metallized layer to the film. The metal atoms or oxide clusters are deposited on the polymer film during plasma treatment. The potential difference and resulting ion current between metal electrodes causes metal to leave the plasma generating electrode and to deposit on and bond to the film polymer surface as a metal or metal oxide cluster.

After the oxygen plasma treatment, an optional metal sputtering step can be used. Following such steps, a thin conductive metal layer can be formed, preferably by vacuum metallization. The conductive layer can comprise carbon, silver, gold, aluminum, polymeric conductive layers, etc. Preferably, a copper vacuum metallization step is used. The step forming the conductive layer results in a layer having a minimum thickness of about 50 nanometers, typically having a thickness of 200 to 300 nanometers, repeated vacuum metallization treatment can increase the thickness to greater than 500 nanometers.

The laminate comprising the plasma treated film and a first metallized layer has a variety of end uses. Metal thicknesses greater than about 300 nanometers can be used in the manufacture of printed circuits having current densities below about 4000 amps per square centimeter. Such films can be used in the formation of printed circuits using a variety of etching modes including printing a resist using laser jet printer technology supported by circuit design software. If large current flows are planned, thicker conductors can be made by forming a second layer on the metallized layer. Onto the metallized layer can be formed a second metal layer having a thickness of at least 0.1 $\mu$m and typically having a thickness of about 2 to 50 $\mu$m. The second metal layer is preferably electroplated.

After fabrication of the metal film laminate, no clear distinction with respect to origin can be drawn between any arbitrary atom in contact with the film surface through the metallization layer into the second layer formed. The metal layer appears to be unitary, even though its formation is step-wise.

The process of the invention is performed by passing a film through a plasma chamber containing metal electrodes. After evacuation of the chamber to a desired pressure, a gaseous material producing ionized oxygen is passed into the chamber at a flow rate to maintain an ionized oxygen plasma with a desired pressure and purity. Power is applied to the working electrodes at a useful current with a steady or pulsed D.C. potential and power level sufficient to create the oxygen plasma. The laminate film material is passed through the oxygen plasma at a distance from the electrode such that the film surface is fully contacted with the plasma and metal-oxide driven from the electrode can impact and bond to the polymer film surface. The plasma treatment can also cause the film material to be dried or cleaned of materials that can interfere in the vacuum metallization or later formation of metal coatings onto the film surface. The temperatures and pressures common in plasma treatment remove surface water, volatile hydrocarbon material and unreacted monomer. After plasma treatment, the film can be vacuum metallized. A second conductive or metal layer then can be formed.

Film Substrate Materials

Films that can be used for forming the metal film laminates of the invention are commonly organic film-forming compositions that can be formed from a variety of common polymeric films including addition polymers, condensation polymers, natural polymers, treated films, thermosetting or thermoplastic resins.

Useful thermosetting resins include phenolic resins, phenol-aldehyde resins, furan resins, amino-plast resins, alkyd resins, allyl resins, epoxy resins, epoxy prepregs, polyurethane resins, thermosetting polyester resins, polyimide bis-maleimide resin, polymaleimide-epoxy resin, polymaleimide-isocyanate resin, silicone resins, cyanate resins, a cyanate-epoxy resins, a cyanate-polymaleimide resins, and a cyanate-epoxy-polymaleimide resin; thermosetting so-called "IPN" as obtained by compounding the above thermosetting resins and engineering plastics such as polyamide (Nylon), aromatic polyester, polyetherimide, polyetherether ketone, polysulfone, and polyphenyleneether, and further adding a catalyst; crosslinkable resins obtained by compounding an organic peroxide as a crosslinking agent and a radical polymerizable polyfunctional compound, a thermosetting resin and the like to resins. Because of the nature of thermosetting resins, they cannot be further heat processed without severe distortion or destruction.

Polyimide film can be used in the preferred film laminate. Preferred polyimides are typically made by a two step reaction involving contacting a tetrabasic acid dianhydride with an aromatic diamine giving first a polyamic acid which is then converted by heat or catalyst into a high molecular weight, linear polyimide. Such polyimides are easily produced as film or sheet.

Thermoplastic resins are also useful in the laminate films of the invention. Useful addition polymers include poly alpha-olefins, polyethylene, polypropylene, poly 4-methyl-pentene-1, ethylene/vinyl copolymers, ethylene vinyl acetate copolymers, ethylene acrylic acid copolymers, ethylene methacrylate copolymers, ethylmethylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols, acrylic polymers made from acrylic acid, methacrylic acid, methylacrylate, methacrylate, acrylamide and others. Fluorocarbon resins such as polytetrafluoroethylene, polyvinylidiene fluoride, and fluorinated ethylenepropylene resins. Styrene resins such as a polystyrene, alpha-methylstyrene, high impact polystyrene acrylonitrile-butadiene-styrene polymers and others and reinforced materials obtained by compounding glass, carbon, alumina, other fibers, fiber cloth, powder and other fillers to the above polymers of these, those having a glass transition temperature of at least 160° C. are preferred. In particular, polymers having a glass transition temperature of at least 140° C. and preferably a $T_g$ of 180° C. or more is preferred in that the metal treatment or forming conditions used during the formation of the copper film can be chosen from a wider range.

A variety of condensation polymers can also be used in the manufacture of the laminates of the invention including nylon (polyamide) resins such as nylon 6, nylon 66, nylon 10, nylon 11, nylon 12, etc. A variety of polyester materials can be made from dibasic aliphatic and aromatic carboxylic acids and di or triols. Representative examples include polyethylene-teraphthlate, polybutylene teraphthlate and others.

Polycarbonates can also be used in the manufacture of the invention. Such polycarbonates are long chained linear polyesters of carbonic acid and dihydric phenols typically made by reacting phosgene ($COCl_2$) with bisphenol A materials resulting in transparent, tough, dimensionally stable plastics. A variety of other condensation polymers are used including polyetherimide, polysulfone, polyethersulfone polybenzazoles, aromatic polysulfones, polyphenylene oxides, polyether ether ketone and others.

Preferred materral for use in the laminate of the invention are polyester film materials such as polyethylene-terephthlate, polybutylene teraphthlate and polyimide materials. These film materials are sold by duPont, Allied-Apical, Teijin, Kanega-fuchi, as Mylar ®, Kapton ®, Apical ®, Upilex ®, etc., films.

Metals

The metals useful in forming the metal film laminate of the invention are metals commonly found in the laminate film applications of the invention including packaging insulation, labels, decorative layers, antistatic films or reflective layers, etc. Such layers are often shiny, metallic layers not subject to substantial corrosion from atmospheric conditions and have substantial electrical conductivity. Preferred metals for use in forming the laminate structures of the invention include aluminum, copper, gold, silver, etc.

Plasma

Although gases normally act as electrical insulators, at sufficiently high temperature or current densities a gas can become a conductor. A plasma generated under such conditions contains free electrons and free positively charged ions. At sufficiently high electron densities, an ionized gas becomes a plasma. The basic property of a plasma is a substantial electrical neutrality. In other words, the numbers of negative charges and positive charges free in volume are approximately equal. The ionization energy of the gas forming the plasma typically is supplied by applying an electric field to the gas to accelerate and scatter ionized electrons and positive ions. For plasma formation to occur, a sufficiently high electric field must be applied. The strength of the electric field depends on the geometry of the plasma chamber and the pressure of the gas. Basic variables of concern in the production of plasma are number densities of electrons and positive ions, plasma pressure, temperature, electric and magnetic field strength and particle velocity.

The electric field through the gas to be ionized to form a plasma is established by applying a potential difference across electrodes inserted in the plasma chamber. Such electrodes for use in this invention are typically manufactured from corrosion and plasma resistant metals such as copper, stainless steel, titanium, aluminum, etc.

Current flows through the plasma from electrode to electrode. The biased current flow in the rods can cause metal to be transferred from electrode to film surface. We have found that in the operation of the plasmas of the invention, that a thin, random, preferably noncontinuous distribution of metal-oxide occurs across the film surface. Such metal-oxide typically comprise oxides of chromium, titanium, iron, nickel, etc., or mixtures thereof. We believe these scattered noncontinuous atoms are characteristic of the formation of the delamination resistant metal layers formed by the subsequent metallization and metal layer formation.

We have found that the 90° peel strength of metal laminates formed in the process of the invention, varies directly with the power used in the plasma generation assuming a constant plasma geometry and throughput of a film. Treatment of a film having a width of 60 to 70 cm and a thickness of 1 to 5 thousandths of an inch in a plasma, we have found that plasmas generated with greater than about 400 watts produce finished film laminates having a peel strength of greater than 3 pounds per inch and at about 800 watts or greater, peel strengths can be on the order of 5 pounds and greater. The increasing power of the plasma appears to increase the peel strength of the laminate.

We have also found that the metal layers formed using the process of this invention are layers having little internal stress. Prior art metallized layers often are higher stressed, resulting in curling or surface distortion.

The plasma volume can take any convenient geometrical size or shape if sufficient time of contact between the high energy plasma and the polymer film occurs. Further, the film can be passed through the plasma volume at any speed ensuring substantial contact. However, we have found that the preferred mode of passing the film through the plasma volume is by a repeated passage of the film past multiple plasma generating electrodes. Often the plasma treatment is conducted in a continuous process in which a long continuous film web is passed through a treatment plasma volume. Such webs can be of substantial length and can require significant process times. Such plasma zones operated at low pressure require low gas leakage from any entrance and exit for the film web. Pressures common in the plasma chamber are less than about 150 mTorr and are preferably between 20 to 80 mTorr. Since substantial gas leakage can occur at the entrance and exit, substantial effort must be directed to the maintenance of proper gas mixture within the chamber and the proper pressure.

Metallization

The plasma treated film is then contacted with a source of a conductive layer. Preferably, a source of metal vapor is used to form a metallized layer on the plasma treated film. Vapor metallization is a low pressure, high temperature (energy) process in which metal vapor is formed. A variety of other layers can be used including carbon, conductive polymers, etc.

Vapor metallization occurs in three basic modes. First, metal wire can be directed into a hot boat or other container at high temperatures and low pressures wherein the metal melt formed in the boat is converted into vapor. Secondly, electron beam excitation of a metal held at low pressure and approximately ambient temperature can cause the production of a pool of molten metal and a metal vapor. Thirdly, the induction heating of metal in a susceptor vessel can result in the production of useful quantities of metal vapor at low pressure.

In common vapor metallization processes, metal is vaporized at a rate sufficient to maintain a substantial quantity of vapor in the treating area. At pressures common in a vapor metallization chamber, metal deposits can be formed at a rate of about 100,000 to 300,000 angstroms per minute. The high energy metal vapor when contacted by organic film layers often condenses and bonds to the substrate, forming a thin metallized layer with a characteristic thickness of about 50 to 500 μm, preferably about 100 to 300 μm. Pressures common in vapor metallization chambers are less than about 0.6 mTorr and are preferably about 0.1 to 0.3 mTorr or less.

The chamber can optionally contain a metal sputtering station used to sputter a second metal layer on the plasma treated surface prior to metallization.

Sputtering

Sputtering is a material transportation phenomenon caused by energetic ions striking a cathode, causing the material making up the cathode to be transferred to a different surface through a momentum transfer mechanism. In the performance of a sputtering technique, the substrate to be coated is placed adjacent to a cathode made of the substance which will form the coating. The cathode is subject to a high negative voltage and is placed in an inert gas atmosphere at low pressure. Under the influence of the high voltage potential difference, atmospheric ions are accelerated against the surface of the cathode wherein the momentum of the ions is transferred to atoms on the surface of the cathode, ejecting the atoms from the surface of the cathode and causing them to contact and adhere to the adjacent substrate. Such sputtering process parameters which affect the sputtering rate include mass and energy (accelerating voltage) of the impinging ions; gas temperature; electrode spacing; material and crystallographic orientation of the cathode; cathode surface (containment layers) and cathode shape and shielding. Inert gases useful for such sputtering techniques include helium, neon, argon, krypton, xenon, nitrogen, etc.

We have found in many films, preferably in polyimide films, that a sputtering step, performed after the metal oxide/plasma step, can also significantly increase laminate properties.

The plasma treatment, sputtering and metallization steps are each carried out at relatively low pressure, typically less than 200 mTorr. These processes can be carried out in a single chamber which is divided into sections operated at a pressure that is optimized for each step. Typically, the metallization occurs at pressures less than 0.5 mTorr, the sputtering occurs at pressures less than 30 mTorr, while the plasma-treatment occurs at pressures between 30 and 200 mTorr.

Formation of Further Metal Layers

The plasma treated, metallized film is particularly suited for the subsequent formation of thick metal layers such as those useful in the end uses discussed above. Such layers can be formed in a variety of techniques, however, electro-plating and electroless plating are the most commonly used metal layer formation techniques.

Electro-plating is the electrodeposition of an adherent metallic coating on an electrode surface to form a metal deposit. The electrode surface being treated is made the cathode in an electro-plating solution or bath. Such baths are typically aqueous solutions from which metal is reduced by the flow of an electric current through a solution of the metal salt. In performing electro-plating of metal on a conductive electrode, the electrode or substrate is often cleaned, rinsed, dipped in acid or is subject to other pretreatment or substrate preparation. In operating electro-plating techniques, the substrate is immersed into a solution and necessary DC power is applied typically from metallic anodes to the substrate cathode. The solutions are often agitated and the temperature current metal concentration and other variables are closely controlled using well known principles.

In the preparation of metal laminates of the invention, the laminate metal is typically copper plated onto a substrate having a metal layer prepared using the copper metallization techniques.

Useful copper layers can also be formed using electroless plating, which is the controlled autocatalytic deposition of a continuous film by the interaction, in a solution of metal salt between a metal and a chemical reducing agent. Electroless deposition can give films of metals, alloys, metallic compounds, and composites on both conductive and non-conductive surfaces. Electroless solutions contain a metal salt, reducing agent, a pH adjuster or buffer, a complexing agent and one or more additives to control solution stability, film properties, deposition rates, etc. Primarily, nickel, copper, gold and silver are plated using electroless techniques. The advantage of electroless plating is the ability to plate metal on non-conductive or poorly conductive surfaces.

Once the metal layer(s) are formed, a printed wiring board can be made by forming the circuit pattern in metal on the film. The pattern can be formed by an etching process or by a semi-additive pattern plating process. In an etching process, a resist and basic etchant baths are used to selectively remove copper leaving the pattern. Alternatively, a conductive circuit pattern can be formed on the laminate of the invention using a semi-additive technique. In such a technique, the circuit pattern is formed in a way to significantly reduce the amount of metal removed through an etching step. In the semi-additive technique, after the first metal layer is formed using metallization, a resist is formed on the first layer. The resist leaves revealed, the first metal layer in the pattern of the desired circuit. Onto the revealed pattern is plated a thick, 0.1 to 40 μm layer of copper using common electroplating or electroless techniques. After the second metal layer in the desired pattern is complete, the resist can be removed, leaving the thick metal pattern and in the areas revealed by the removal of resist, the thin metallized layer. The remaining revealed metallized areas are then removed using a light etch. The metallized layers are thin and require brief etching and it substantially reduces the amount of metal removed, the amount of etchant consumed and substantially reduces the amounts of waste materials.

Detailed Description of the Drawings

FIG. 1 is a cross-sectional representation of a single unit treatment chamber containing plasma treatment, metal sputtering and vacuum metallizing stations, each station having a different operating pressure. Film to be treated is provided by a film roll 10 which delivers film 10a to the plasma treatment station 11. Plasma treatment station 11 is operated at a pressure of about 30 to 150 mTorr and contains stainless steel glow rods 13 fixed in position to treat surface of the film as it passes through the plasma treatment station 11. The rods are fixed in a frame 14 maintained by supports 14a. The film passes over a series of rollers 12 for a multiple passes near the treatment rods 13. The film passes from the plasma treating station and re-enters the upper vacuum chamber 16 maintained at a pressure of about 3 to 30 mTorr and can optionally be treated by a sputtering station 15. The film then passes to a coating roll 17 wherein the surface of the film can be exposed to a metallic vapor in a lower chamber 18 having a residual gas pressure of about 0.1 to 0.4 mTorr. Copper wire is introduced into heated boats 19 at a temperature of about 1600° C. At this temperature and pressure, substantial quantities of copper vapor are created which condense and adhere to the film in a uniform low stress metal coating. After vacuum metallization is complete in chamber 18, the film 10a is introduced into a take-up mechanism 20 where the film 10a is wound on a roll.

The following examples provide specific embodiments of the preparation of the film laminate materials of the invention and provide evidence that the peel strength of the laminate is a result of a cooperation between the plasma pre-treatment, the metallization step and the subsequent metal formation step.

Figure 2:
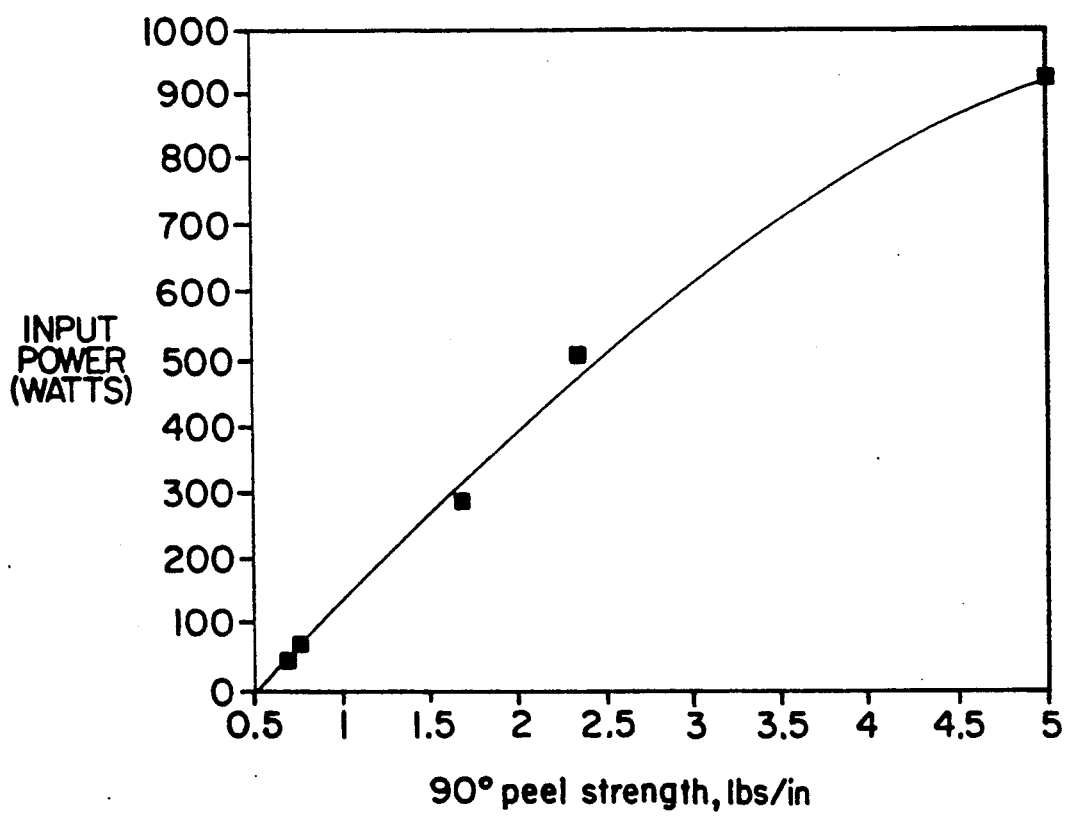
FIG. 2 is a graphical representation of the relationships between ionized oxygen plasma input power and final 90° peel strength.

FIG. 2 is a graphical representation of the relationship between plasma input power and the 90° peel strength of electro-plated films made using the treatment of the invention. The figure shows that the increase in peel strength is directly proportional to the increase in plasma input power which is related to the ability of the plasma to form a random distribution of metal-oxide on the cleaned-treated film surface. These randomly distributed metal-oxide regions cooperate in bonding first the vacuum metallized layer and secondly, the second metal layer formed on the film and act as an important part of the novel attachment structure.

EXAMPLES 1–6

Copper Treatment of Polyester Film

An experiment was conducted to determine the properties of laminate made according to the invention involving an oxygen plasma treatment, and a copper vapor metallization of polyester film. The film is treated in the treatment mechanism of FIG. 1 with no subsequent metal sputtering (except for Example 2) at sputter station 15 (see FIG. 1). The goal of the polyester treatment experiment was to find important parameters affecting single pass treatment of film and copper deposition. An initial goal was to obtain greater than 1 pound per peel strength on 1 ounce copper plated on the polyester film. We have monitored the variables in the test including coating drum temperature, fraction of water vapor in oxygen gas treatment, rod current at set voltage, gas pressure, film speed, film thickness, etc. We have found the only statistically significant variable in obtaining high peel strength are film speed through the treatment unit and current in the treatment unit at a fixed voltage. Both these variables indicate that the production and treatment of film with metal-oxide in the plasma unit is a major contributor to increase peel strengths. Increasing the film rate through the treatment would tend to reduce the effects of the plasma treatment on the film. Varying the current in the treatment unit would also vary the amount of treatment occurring on the film surface. We have found that by increasing the power input to the plasma treatment unit and maintaining the film speed at certain controlled rates, that a fully treated film can be prepared having high peel strengths after plating.

TABLE I

The results of this experiment and similar experiments are shown graphically as FIG. 2 which relates plasma power against 90° peel strength lb/in.

| Ex. | Polyester Film Thickness (mils) | O$_2$ Gas Flow (cc/min) | Press mTorr | Volts | Amps | Rod | Sputtered Cu | Plating Step Metal | Plating Step Thickness | ¼" - 90° Peel Strength |
|---|---|---|---|---|---|---|---|---|---|---|
| 1 | 3 | 14 | 31 | 2000 | 0.46 | S.S.304 | No | Cu | 35 μM | 5.00 |
| 2 | 3 | 14 | 31 | 2000 | 0.46 | S.S.304 | Yes | Cu | 35 μM | 4.60 |
| 3 | 5 | 28 | 50 | 650 | 0.10 | S.S.304 | No | Cu | 35 μM | 0.77 |
| 4 | 3 | 32 | 50 | 1100 | 0.46 | S.S.304 | No | Cu | 35 μM | 2.35 |
| 5 | 3 | 36 | 100 | 700 | 0.46 | S.S.304 | No | Cu | 35 μM | 3.60 |
| 6 | 3 | 25 | 100 | 700 | 0.46 | S.S.304 | No | Cu | 35 μM | 3.50 |

EXAMPLE 7

An experiment was conducted to determine the nature of the surface of a polyester film made according to the invention involving the oxygen plasma treatment produced by metal electrodes. The film was treated in a plasma treatment mechanism of FIG. 1 with no metal sputtering step. The goal of the polyester treatment experiment was to discover how the plasma treatment changed the nature of the treated polyester surface. In the experiment, large rolls of PET film were copper vacuum metallized at speeds ranging from 10 to 100 feet per minute in the mechanism of FIG. 1. The films were treated in a large plasma treatment chamber.

Several of the treated PET films were submitted for evaluation of the nature of the metal on the surface of the PET film. Samples were analyzed by ESCA and ISS under identical conditions. Angle resolved ESCA analysis was performed to enhance surface sensitivity. In the conventional or "normal" mode of ESCA data collection, electron detectors oriented to view the sample along a perpendicular to the sample surface. For the angle resolved or "tilted" mode, the sample was tilted so that only electrons escaping in an angle approximately 12° from the surface are detected. Normal ESCA spectra represent sampling depth of 82–100 A wherein the tilted spectra represent a depth of 20–30 A. Additional data were obtained by scanning narrow energy regions of the spectrum at higher resolutions to determine the relative amounts of specific elements in various bonding states such as carbon bonded as carbon to carbon, carbon-oxygen, carbon-carbonyl and carboxy. ISS (Ion Scattering Spectroscopy) and SIM (Secondary Ion Mass Spectroscopy) analysis were done on the selected samples. Comparing the elemental depth profile for information from ISS on the raw and on the plasma-treated polymer, chromium and copper are detected on the film surface. Neither copper or chromium is detected on raw untreated polymer. The chromium on the film is derived from the stainless steel components of the plasma generating mechanism and is believed to be in the form of chromium-oxide regions. Copper is derived from the vacuum metallizing station. In performing the analysis, a small proportion of each sample approximately ½ in² was cut and mounted on a stainless steel stub with double faced adhesive tape. All samples for analysis were analyzed with a Kratos X-San 800 combined scanning auger microprobe ESCA (Electron Spectroscopy for Chemical Analysis also termed X-Ray Photo Electron Spectroscopy) equipped with a turbo molecular pump sample introduction system and DEC micro PDP-11 computer data acquisition system with a Tektronic color terminal and color printed. System and base pressures normally maintained below $2 \times 10^{-10}$ Torr using a 300 liter per second ion pump and titanium sublimators to minimize contributions from vacuum contaminants. The sample is excited by a dual anode x-ray source with a choice of aluminum or magnesium anodes The presence of chromium in such copper layers and on the surface of the products of the invention indicates that the metal plasma generating electrodes used in the plasma treatment station introduce metal atoms onto the surface of the treated polyester film. The chromium atoms embedded in the film act in concert with subsequent metal layers as a structured attachment layer that significantly increases 90° peel strength.

EXAMPLES 8-59

POLYIMIDE

An experiment was conducted to determine the properties of a polyimide film-copper laminate made according to the invention involving an oxygen plasma treatment using a variety of metal electrodes, a copper sputtering treatment in an inert atmosphere, a copper metallization step in which the sputtered copper film was then plated with copper to a thickness of from about 0.85 to 3.5 thousandths of an inch in thickness with then tested for peel strength under wet and dry conditions. The thickness of the film ranged from 1 to 5 thousandths of an inch. The plasma treatment was done in an oxygen atmosphere. Copper was sputtered in an inert atmosphere on to the polyimide film and a thin layer of a copper was then metallized under typical conditions. The data summarized on the table below show that the treatment of the polyimide materials using such techniques result in very high peel strengths attained in the absence of a chromium "tie coat". Further, surprisingly, the peel strengths of the polyimide laminate material remains high in the presence of substantial humidity. In the past, polyimide laminates, when exposed to high humidity, could lose as much as 80% of the peel strength. The data below show that while the peel strength in certain experiments drops some, the percentage loss of peel strength due to humidity is significantly improved.

TABLE II

| | | | Laminate Preparation | | | | | | |
|---|---|---|---|---|---|---|---|---|---|
| | Film | | Plasma Treater | | Sputtering | | | | Plating |
| Example | Type | Thk. (× 0.001 in) | Gas | Rod Type | Metal | Pressure millitorr | Volts | Amps | Vapor Dep. Metal | Thickness (× 0.001 in) |
| 8 | Kapton | 2 | O$_2$ | S.S. | Cu | 10.4 | 500 | 6.0 | Cu | 2.00 |
| | Lamtech 9210 | 2 | O$_2$ | S.S. | Cu | | | | Cu | |
| 10 | Apical NP | 2 | O$_2$ | Cu. | Cu | 8.8 | 460 | 5.2 | Cu | 3.30 |
| | Kapton | 2 | O$_2$ | S.S. | Cu | 10.4 | 500 | 6.0 | Cu | 1.90 |
| | Apical NP | 2 | O$_2$ | Ti. | Cu | 8.8 | 460 | 5.2 | Cu | 1.50 |
| | Apical NP | 2 | O$_2$ | Al. | Cu | 8.9 | 480 | 4.4 | Cu | 1.50 |
| | Apical NP | 2 | O$_2$ | S.S. | Cu | 10.4 | 500 | 6.0 | Cu | 0.85 |
| 15 | Apical NP | 2 | O$_2$ | Cr. | Cu | 8.5 | 500 | 4.3 | Cu | 2.30 |
| | Apical NP | 2 | O$_2$ | S.S. | Cu | 6.6 | 480 | 2.2 | Cu | 1.70 |
| | Apical NP | 2 | O$_2$ | S.S. | Cu | 6.6 | 480 | 2.2 | Cu | 3.13 |
| | Apical NP | 2 | O$_2$ | S.S. | Cu | 6.6 | 480 | 1.0 | Cu | |
| | Apical NP | 2 | O$_2$ | S.S. | Cu | 6.3 | 480 | 5.0 | Cu | 1.15 |
| 20 | Apical NP | 2 | O$_2$ | S.S. | Cu | 10.5 | 460 | 4.0 | Cu | 1.47 |
| | Apical NP | 2 | O$_2$ | S.S. | Cu | 10.4 | 500 | 6.0 | Cu | 1.70 |
| | Apical NP | 2 | O$_2$ | S.S. | Cu | 6.6 | 480 | 1.0 | Cu | |
| | Apical NP | 2 | O$_2$ | S.S. | Cu | 6.6 | 480 | 1.0 | Cu | 1.70 |
| 24 | Apical NP | 2 | O$_2$ | S.S. | Cu | 6.6 | 480 | 1.0 | Cu | |
| 25 | Apical NP | 2 | O$_2$ | S.S. | Cu | 6.6 | 480 | 1.0 | Cu | 1.10 |
| | Apical NP | 2 | O$_2$ | S.S. | Cu | 6.6 | 480 | 1.0 | Cu | |
| | Kapton VN | 2 | O$_2$ | S.S. | Cu | | | | Cu | 3.20 |

TABLE II-continued

Laminate Preparation

| Example | Film Type | Film Thk. (× 0.001 in) | Plasma Treater Gas | Plasma Treater Rod Type | Sputtering Metal | Sputtering Pressure millitorr | Sputtering Volts | Sputtering Amps | Vapor Dep. Metal | Plating Thickness (× 0.001 in) |
|---|---|---|---|---|---|---|---|---|---|---|
|  | Apical NP | 2 | O₂ | S.S. | Cu | 6.6 | 480 | 1.0 | Cu |  |
|  | Apical NP | 2 | O₂ | S.S. | Cu | 10.4 | 500 | 6.0 | Cu | 1.67 |
| 30 | Upilex R | 1 | O₂ | Cr. | Cu | 8.5 | 500 | 4.3 | Cu | 2.47 |
|  | Upilex R | 1 | O₂ | Cu. | Cu | 8.8 | 460 | 5.2 | Cu | 1.70 |
|  | Kapton VN | 2 | O₂ | Cr. | Cu | 8.5 | 500 | 4.3 | Cu | 2.85 |
|  | Apical NP | 2 | O₂ | S.S. | Cu | 6.6 | 480 | 2.2 | Cu | 1.60 |
|  | Kapton H | 2 | O₂ | S.S. | Cu | 10.5 | 460 | 4.0 | Cu | 1.85 |
| 35 | Kapton VN | 2 | O₂ | Al. | Cu | 8.9 | 480 | 4.4 | Cu | 1.30 |
|  | Kapton H | 2 | O₂ | Al. | Cu | 8.9 | 480 | 4.4 | Cu | 1.25 |
|  | Upilex R | 1 | O₂ | Al. | Cu | 8.9 | 480 | 4.4 | Cu | 1.44 |
|  | Kapton H | 2 | O₂ | Cr. | Cu | 8.5 | 500 | 4.3 | Cu | 1.50 |
|  | Kapton VN | 2 | O₂ | S.S. | Cu | 10.5 | 460 | 4.0 | Cu | 1.73 |
| 40 | Kapton H | 2 | O₂ | Cu. | Cu | 8.8 | 460 | 5.2 | Cu | 2.30 |
|  | Upilex R | 1 | O₂ | Ti. | Cu | 8.8 | 460 | 5.2 | Cu | 1.50 |
|  | Kapton H | 2 | O₂ | Ti. | Cu | 8.8 | 460 | 5.2 | Cu | 1.00 |
|  | Apical NP | 2 | O₂ | S.S. | Cu | 7.3 | 520 | 6.0 | Cu | 1.07 |
|  | Apical NP | 2 | O₂ | S.S. | Cu | 6.3 | 540 | 5.5 | Cu | 0.60 |
| 45 | Apical NP | 2 | O₂ | S.S. | Cu | 6.4 | 530 | 5.0 | Cu |  |
|  | Upilex R | 1 | O₂ | S.S. | Cu | 10.5 | 460 | 4.0 | Cu | 1.00 |
|  | Apical NP | 2 | O₂ | S.S. | Cu | 6.4 | 530 | 5.0 | Cu | 0.90 |
|  | Kapton VN | 2 | O₂ | Cu. | Cu | 8.8 | 460 | 5.2 | Cu | 1.58 |
|  | Apical NP | 2 | O₂ | S.S. | Cu | 12.8 | 480 | 5.0 | Cu | 0.90 |
| 50 | Upilex S | 1 | O₂ | Cr. | Cu | 8.5 | 500 | 4.3 | Cu | 1.40 |
|  | Upilex S | 1 | O₂ | Ti. | Cu | 8.8 | 460 | 5.2 | Cu | 0.80 |
|  | Upilex S | 1 | O₂ | Al. | Cu | 8.9 | 480 | 4.4 | Cu | 0.90 |
|  | ICI Upilex | 2 | O₂ | S.S. | Cu | 10.5 | 460 | 4.0 | Cu | 1.00 |
|  | ICI Upilex | 2 | O₂ | Ti. | Cu | 8.8 | 460 | 5.2 | Cu | 1.50 |
| 55 | Upilex S | 1 | O₂ | S.S. | Cu | 10.5 | 460 | 4.0 | Cu | 1.10 |
|  | Upilex S | 1 | O₂ | Cu. | Cu | 8.8 | 460 | 5.2 | Cu | 1.23 |
|  | ICI Upilex | 2 | O₂ | Cr. | Cu | 8.5 | 500 | 4.3 | Cu | 1.25 |
|  | ICI Upilex | 2 | O₂ | Cu. | Cu | 8.8 | 460 | 5.2 | Cu | 1.46 |
| 59 | ICI Upilex | 2 | O₂ | Al. | Cu | 8.9 | 480 | 4.4 | Cu | 2.47 |

TABLE III

Peel Strength Testing of the Materials in Table II
Units: lbs/in width

| Example | 90° | 90° (wet) |
|---|---|---|
| 8 | 11.2 | 10.9 |
|  | 10.0 |  |
| 10 | 8.0 | 6.4 |
|  | 7.3 | 7.2 |
|  | 7.0 | 6.4 |
|  | 6.9 | 7.3 |
|  | 6.8 |  |
|  | 6.8 | 7.3 |
|  | 6.6 | 6.5 |
|  | 6.5 |  |
|  | 6.2 |  |
|  | 5.7 |  |
| 20 | 5.7 | 5.5 |
|  | 5.6 | 5.8 |
|  | 5.6 |  |
|  | 5.6 | 4.2 |
|  | 5.6 |  |
|  | 5.6 |  |
|  | 5.5 |  |
|  | 5.4 |  |
| 28 | 5.4 |  |
| 29 | 5.3 | 5.2 |
|  | 5.3 | 5.7 |
|  | 5.2 | 4.4 |
|  | 5.1 | 5.7 |
|  | 5.1 | 3.8 |
|  | 5.1 | 5.3 |
|  | 4.9 | 6.2 |
|  | 3.8 | 5.6 |
|  | 4.7 | 3.9 |
|  | 4.7 | 5.2 |
|  | 4.6 | 5.8 |
| 40 | 4.6 | 4.7 |
|  | 4.4 | 3.6 |
|  | 4.2 | 4.3 |
|  | 3.8 |  |
|  | 3.6 |  |
| 45 | 3.6 |  |
|  | 3.5 | 3.6 |
|  | 3.4 |  |
| 48 | 3.4 | 3.4 |
| 49 | 3.3 | 2.4 |
|  | 1.9 | 1.4 |
|  | 1.8 | 1.6 |
|  | 1.7 | 2.4 |
|  | 1.6 | 1.2 |
|  | 1.6 | 1.3 |
|  | 1.6 | 2.2 |
|  | 1.6 | 1.7 |
|  | 1.3 | 1.2 |
|  | 1.2 | 1.2 |
| 59 | 1.1 | 2.1 |

EXAMPLES 60–124

Polyester

An experiment was conducted to determine the properties of a laminate made with polyester, polyethylene, polypropylene, poly-4-methyl-pentene-1, etc., according to the invention, involving an oxygen plasma metal-oxide treatment and a copper vapor metallization of various films. In this experiment, a variety of poly films having a thickness of from about 1 to about 5 thousandths of an inch were treated in a plasma chamber using oxygen gas or water vapor using a variety of electrode types, including stainless steel, aluminum, chromium, titanium, and copper. After the plasma treatment, which created metal oxide regions on the film surface, the treated film surface was then metallized with copper using common copper vapor metallization techniques. After metallization was complete, the film was plated with copper to a thickness of from about 0.9 to about 2.2 thousandths of an inch and tested for peel strength. The results of these experiments are set forth in the table below showing substantial, reliable peel strengths for the copper film laminate material.

EXAMPLES 126–127

Two samples (10" each) of a 62" width double sided copper laminates formed on Apical NP (A) and Kapton VN film (B) with 1 oz. copper, were tested for dimensional stability (Methods B and C), chemical stability and moisture resistance.

TABLE IV

| | | | | | | |
|---|---|---|---|---|---|---|
| | | Laminate Preparation and Peel Strength | | | | |
| | Film | | Plasma Treater | | Plating | Peel |
| Example | | Thickness (× 0.001 in) | Gas | Rod Type | Vapor Dep. Metal | Thickness (× 0.001 in) | Testing 90° |
| 60 | Teijin SL | 3 | $O_2$ | S.S. | Cu | | 5.00 |
| | Teijin SL | 3 | $O_2$ | S.S. | Cu | | 4.60 |
| | Teijin sl | 3 | $O_2$ | S.S. | Cu | 1.63 | 3.87 |
| | AH 4600 | 2 | $O_2$ | S.S. | Cu | | 3.6 |
| | ICI 377 | 3 | $O_2$ | S.S. | Cu | | 3.5 |
| | AH 4660 | 3 | $O_2$ | Al. | Cu | 1.5 | 3.08 |
| | AH 4660 | 3 | $O_2$ | S.S. | Cu | 1.00 | 3.05 |
| | Teijin sl | 3 | $O_2$ | Cr. | Cu | 0.90 | 2.81 |
| | Teijin sl | 3 | $O_2$ | Al. | Cu | 1.13 | 2.73 |
| | TPX 88 | 2 | $O_2$ | Cr. | Cu | 0.90 | 2.65 |
| 70 | Mylar D | 2 | $O_2$ | S.S. | Cu | 1.00 | 2.60 |
| | Mylar D | 2 | $O_2$ | Ti. | Cu | 2.00 | 2.56 |
| | Teijin SL | 3 | $O_2$ | S.S. | Cu | | 2.35 |
| | Teijin SL | 3 | $O_2$ | S.S. | Cu | 1.40 | 2.10 |
| | TPX 22 | 2 | $O_2$ | Cu. | Cu | 1.40 | 2.04 |
| | AH 3000 | 2 | $O_2$ | S.S. | Cu | | 2.00 |
| | ICI 343 | 2 | $O_2$ | S.S. | Cu | | 2.00 |
| | Teijin SL | 3 | $H_2O$ | S.S. | Cu | | 1.95 |
| | Teijin SL | 3 | $O_2$ | Ti. | Cu | 1.00 | 1.94 |
| | Teijin SL | 2 | | S.S. | Cu | | 1.90 |
| 80 | Teijin SL | | $O_2$ | SS | Cu | 1.50 | 1.90 |
| | Teijin SL | 3 | $O_2$ | S.S. | Cu | 1.40 | 1.80 |
| | AH RN | 2 | $O_2$ | S.S. | Cu | | 1.70 |
| | Teijin SL | 5 | $O_2$ | S.S. | Cu | | 1.69 |
| | Teijin sl | | $O_2$ | SS | Cu | 1.5 | 1.64 |
| | TPX 22 | 2 | $O_2$ | Al. | Cu | 1.50 | 1.62 |
| | Teijin SL | 5 | $H_2O$ | S.S. | Cu | | 1.41 |
| | Teijin sl | | $O_2$ | SS | Cu | 1.50 | 1.40 |
| | Teijin SL | 5 | $H_2O$ | S.S. | Cu | | 1.37 |
| 89 | AH 4660 | 3 | $O_2$ | Cr. | Cu | 0.90 | 1.33 |
| 90 | Teijin SL | 3 | $O_2$ | S.S. | Cu | | 1.10 |
| | ICI 505 | 5 | $O_2$ | S.S. | Cu | 1.10 | 1.10 |
| | SKC SN81 | 2 | | S.S. | Cu | | 1.10 |
| | Teijin SL | 3 | $H_2O$ | S.S. | Cu | | 1.05 |
| | AH WN | 2 | $O_2$ | S.S. | Cu | | 1.00 |
| | AH 4600 | 3 | $O_2$ | Ti. | Cu | 1.17 | 0.95 |
| | Teijin SL | 5 | $O_2$ | S.S. | Cu | | 0.77 |
| 100 | Polyethlene | 1 | $O_2$ | Cu. | Cu | 1.50 | 0.76 |
| | AH 440 | 2 | $O_2$ | S.S. | Cu | | 0.72 |
| | Teijin SL | 3 | $O_2$ | S.S. | Cu | | 0.70 |
| | TPX 88 | 2 | $O_2$ | S.S. | Cu | 1.40 | 0.62 |
| | Teijin SP2 | 2 | | S.S. | Cu | | 0.60 |
| | Polypropylene | 1 | $O_2$ | Cr. | Cu | 1.30 | 0.60 |
| | Polyethylene | 1 | $O_2$ | Al. | Cu | 2.01 | 0.57 |
| | Polyethylene | 1 | $O_2$ | Ti. | Cu | 1.60 | 0.57 |
| | Polypropylene | 1 | $O_2$ | S.S. | Cu | 0.50 | 0.55 |
| | Polypropylene | 1 | $O_2$ | Al. | Cu | 0.95 | 0.53 |
| | Polyethylene | 1 | $O_2$ | Cr. | Cu | 1.50 | 0.51 |
| | TPX 88 | 2 | $O_2$ | Al. | Cu | 1.30 | 0.43 |
| | Teijin SL | 3 | $O_2$ | Cu. | Cu | 2.00 | 0.30 |
| 110 | AH 4600 | 3 | $O_2$ | Cu. | Cu | 2.20 | 0.30 |
| | Polypropylene | 1 | $O_2$ | Cu. | Cu | 1.50 | 0.28 |
| | AH 4500 | 2 | $O_2$ | S.S. | Cu | | 0.21 |
| | Teinjin SP | 2 | | S.S. | Cu | | 0.20 |
| | Teijin HP7 | 2 | | S.S. | Cu | | 0.20 |
| | SKC SH82 | 2 | | S.S. | Cu | | 0.20 |
| | SKC SH92 | 2 | | S.S. | Cu | | 0.12 |
| | ICI 505ST | 5 | $O_2$ | S.S. | Cu | | 0.10 |
| | ICI 561 | 3 | $O_2$ | S.S. | Cu | | 0.01 |
| 119 | TPX 22 | 2 | $O_2$ | Ti. | Cu | | NA |
| 121 | TPX 88 | 2 | $O_2$ | Ti. | Cu | | NA |
| | TPX 88 | 2 | $O_2$ | Cu. | Cu | NA | NA |
| | Mylar D | 2 | $O_2$ | Cr. | Cu | 1.03 | no start* |
| | Mylar D | 2 | $O_2$ | Al. | Cu | 1.80 | no start |
| 124 | TPX 22 | 2 | $O_2$ | Cr. | Cu | 2.50 | no start |

*No start indicates a very high peel strength, i.e., greater than 5 pounds per inch.

| | Dimensional Stability Results | | | |
|---|---|---|---|---|
| | Method B | | Method C | |
| Sample | M.D. | T.D. | M.D. | T.D. |
| A-side 1* | −0.0319% | +0.0201% | −0.0437% | +0.0361% |
| A-side 2** | −0.0409% | +0.0362% | −0.0469% | +0.0357% |
| B-side 1* | +0.0163% | +0.0517% | −0.0198% | +0.0415% |
| B-side 2** | +0.0090% | +0.0351% | −0.0126% | +0.0384% |

*Two samples were tested, results were averaged.
**One sample of side 2 was tested.

| Chemical/Stability or Resistance 90° Peel Strength After Chemical Dip Per IPC 650 TM, 2.3.2. (.020" Wide Etch Conductors) | | |
|---|---|---|
| | Polyimide (lbs./in. width) | Polyethylterephthalate (lbs./in. width) |
| Control | 5.52 | 1.16 |
| | | .65 |
| | | 1.03 |
| After Exposure to: | | |
| Methylene Chloride | 5.18 | 1.10 |
| | | 1.48 |
| | | .73 |
| Monoethanol Amine | 5.59 | 1.15 |
| | | .71 |
| | | .86 |
| 2N H$_2$SO$_4$ | 5.57 | 1.19 |
| | | .92 |
| | | .94 |
| Isopropyl Alcohol | 4.87 | 1.35 |
| | | .98 |
| | | .87 |
| MEK | 5.30 | 1.65 |
| | | .93 |
| | | .93 |
| Trichloroethylene | 5.00 | 1.17 |
| | | .87 |
| | | .65 |

| Moisture Absorption | |
|---|---|
| The average water absorption for Sample #A (three samples measured): | 0.89% |
| The average water absorption for Sample #A (three samples measured): | 0.69% |

The above discussion, examples and data provide a detailed explanation that can provide an understanding of our developments and the current embodiments of the invention. However, a number of embodiments of our invention can be made without departing from the spirit and the scope of the invention. The invention is found in the claims hereinafter appended.

We claim:

1. A metal-film laminate, resistant to the delamination of the metal from the film, which laminate comprises:
   (a) a film layer having at least one surface bearing a non-continuous random distribution of metal-oxide, said metal-oxide selected from the group consisting of oxides of iron, chromium, nickel, molybdenum, manganese, zirconium or mixtures thereof, said distribution less than 20 atomic layers in thickness; and
   (b) a metal surface adhered to the film through the random distribution, said metal surface comprising:
      (i) a first metal layer, formed on the metal-oxide regions by vapor metallization, having a thickness of about 50 to 500 nanometers; and
      (ii) a second metal layer having a thickness of 0.1 to 40 μm formed on the first metal layer;
   wherein the peel strength of the metal-film laminate is at least 3 pounds per inch.

2. The laminate of claim 1 wherein the metal-oxide regions result from a film treatment with a plasma comprising ionized oxygen, produced from a metallic electrode comprising a metal selected from the group consisting of manganese, chromium, nickel, iron, molybdenum or mixtures thereof.

3. The laminate of claim 1 wherein the second metal layer is a copper layer formed by electrodeposition.

4. The laminate of claim 1 wherein the first metal layer comprises aluminum, gold, silver or alloys thereof.

5. The laminate of claim 3 wherein the first metal layer comprises copper.

6. The laminate of claim 5 wherein the second metal layer comprises copper.

7. The laminate of claim 1 wherein the film comprises a thermoplastic.

8. The laminate of claim 7 wherein the thermoplastic comprises a polyester.

9. The laminate of claim 1 wherein the film comprises a thermoset resin.

10. The laminate of claim 1 wherein the film comprises a polyimide.

11. The process of claim 1 wherein the film comprises a fluorine containing polymer.

12. The laminate of claim 1 wherein the film comprises a polyetherimide.

13. A metal-film laminate, resistant to the delamination of the metal from the film, which laminate comprises:
   (a) a polymeric film;
   (b) a non-continuous random distribution on the polymeric film, having a thickness of less than 5 atomic layers, said distribution comprising an oxide of a metal selected from the group consisting of chromium, iron, nickel, manganese, molybdenum, zirconium or mixtures thereof; and
   (c) a metal surface adhered to the film through the random distribution, said surface comprising:
      (i) a copper metal layer formed by vapor metallization having a thickness of about 50 to 500 nanometers; and
      (ii) a second metal layer having a thickness of 0.1 to 40 μm formed on the metallized layer; wherein the peel strength of the metal thermoplastic film laminate is at least 3 pounds per inch.

14. The laminate of claim 13 wherein the metal-oxide regions result from an oxygen plasma produced from a metallic electrode.

15. The laminate of claim 13 wherein the second metal layer is formed by electrodeposition.

16. The laminate of claim 13 wherein the first metal layer comprises a metal selected from the group consisting of gold, silver, aluminum, or alloys thereof.

17. The laminate of claim 13 wherein the second metal layer comprises copper.

18. The laminate of claim 13 wherein the metal-oxide regions comprise a chromium-oxide in a thickness of less than 5 atom monolayers.

19. The laminate of claim 13 wherein the film comprises a thermoplastic.

20. The laminate of claim 19 wherein the thermoplastic comprises a polyester.

21. The laminate of claim 20 wherein the polyester comprises poly-ethylene-terephthalate.

22. The laminate of claim 13 wherein the film comprises a polyimide.

23. The laminate of claim 13 wherein the film comprises a polyetherimide.

24. A metal-film laminate, resistant to delamination of the metal from the film, which laminate comprises:
  (a) a film layer having at least one surface bearing a non-continuous random distribution of metal-oxide, said metal-oxide selected from the group consisting of oxides of iron, chromium, nickel, molybdenum, manganese, zirconium, or mixtures thereof, said distribution less than 5 atomic layers in thickness; and
  (b) a copper surface adhered to the film through the random distribution, said copper surface comprising:
    (i) a first copper layer, formed on the metal-oxide regions by vapor metallization, having a thickness of about 50–500 nanometers; and
    (ii) a second copper layer having a thickness of 0.1 to 40 $\mu$m formed on the first copper layer;
  wherein the peel strength of the copper-film laminate is at least 3 pounds per inch.

25. The laminate of claim 24 wherein the second copper layer is formed by electro-deposition.

26. The laminate of claim 24 wherein the film comprises a thermoplastic.

27. The laminate of claim 26 wherein the thermoplastic comprises a polyester.

28. The laminate of claim 26 wherein the film comprises a polyimide.

29. The laminate of claim 24 wherein the film comprises a polyetherimide.

* * * * *